(12) United States Patent
Brisighella, Jr. et al.

(10) Patent No.: US 8,234,034 B2
(45) Date of Patent: Jul. 31, 2012

(54) ENHANCED ELECTRONIC ASSEMBLY

(75) Inventors: Dario G. Brisighella, Jr., North Logan, UT (US); Stephen Bogdan, Huntington Woods, MI (US); William M. Leach, West Bloomfield, MI (US); Jeffrey T. Kida, Layton, UT (US); Richard Rakes, Jr., Milan, MI (US)

(73) Assignee: Autoliv ASP, Inc., Ogden, UT (US)

( * ) Notice: Subject to any disclaimer, the term of this patent is extended or adjusted under 35 U.S.C. 154(b) by 461 days.

(21) Appl. No.: 12/492,463

(22) Filed: Jun. 26, 2009

(65) Prior Publication Data
US 2010/0332074 A1      Dec. 30, 2010

(51) Int. Cl.
*G01M 17/00*      (2006.01)
(52) U.S. Cl. ........ 701/29.1; 701/31.4; 701/36; 701/412; 280/735
(58) Field of Classification Search .................. 701/29.4, 701/29.7, 34.4, 36, 53, 412, 29.1, 31.4; 280/734, 280/735, 736
See application file for complete search history.

(56) References Cited

U.S. PATENT DOCUMENTS

| 6,341,562 | B1 | 1/2002 | Brisighella | |
|---|---|---|---|---|
| 7,473,585 | B2 | 1/2009 | Brandenburg et al. | |
| 7,500,394 | B2 | 3/2009 | Steele | |
| 2008/0110739 | A1* | 5/2008 | Peng et al. ..................... | 200/5 R |
| 2008/0284145 | A1* | 11/2008 | Breed ........................... | 280/736 |

FOREIGN PATENT DOCUMENTS

| DE | 102008022973 A1 | 11/2009 |
|---|---|---|
| WO | WO2010014550 A2 | 2/2010 |

* cited by examiner

*Primary Examiner* — Gertrude Arthur Jeanglaude
(74) *Attorney, Agent, or Firm* — Sally J. Brown; Kacvinsky Daisak PLLC (57) ABSTRACT

Remote sensor units for a vehicle are described. A remote sensor unit may comprise an electronic assembly. The electronic assembly may comprise an electronic component. The electronic assembly may comprise one or more signal terminals coupled to the electronic component. The electronic assembly may comprise a protective enclosure arranged to encapsulate the electronic component. The protective enclosure is arranged to isolate the electronic component from thermal energy, pressure or residual material stress associated with one or more satellite housings. Other embodiments are described and claimed.

19 Claims, 7 Drawing Sheets

ENHANCED ELECTRONIC ASSEMBLY

BACKGROUND

A vehicle safety system typically relies upon a host of electronic sensors designed to monitor and provide data about certain conditions for the vehicle. For instance, an impact detection system may use various types of impact sensors to provide data to an airbag control unit which calculates an angle of impact, severity and force of an impact to determine whether to deploy one or more airbag stages. To improve performance, the electronic sensors are positioned around various portions of a vehicle to optimize sensing capabilities and coverage. Mounting an electronic sensor to a vehicle, however, typically requires a fastening mechanism separate from that of the electronic sensor itself. This increases assembly and manufacturing costs due to multiple components. This also creates a need for more installation steps and thus more time is needed to install the electronic sensor. Further, some areas of a vehicle place increasing operational demands on electronic sensors, oftentimes exposing electronic sensors to harsh environmental conditions. In addition, placement of electronic sensors in some areas of the vehicle may require a more compact design capable of mounting throughout tight spaces in a vehicle. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, for example, an electronic assembly may comprise an electronic component. The electronic assembly may comprise one or more signal terminals coupled to the electronic component. The electronic assembly may comprise a protective enclosure arranged to encapsulate the electronic component. The protective enclosure is arranged to isolate the electronic component from thermal energy, pressure or residual material stress associated with one or more satellite housings. For instance, a satellite housing may comprise an overmold formed around the electronic assembly using an injection molding technique, or a standard fastener formed with one or more apertures to receive the electronic assembly. Other embodiments are described and claimed.

These and other features and advantages will be apparent from a reading of the following detailed description and a review of the associated drawings. It is to be understood that both the foregoing general description and the following detailed description are explanatory only and are not restrictive of aspects as claimed.

DETAILED DESCRIPTION

Various embodiments are generally directed to electronic packages suitable for use with a device or system. Some embodiments may be particularly directed to electronic packages suitable for use with a motor vehicle. For instance, an electronic component may be populated and then encapsulated by a protective enclosure to form an electronic assembly. The protective enclosure may be specifically designed to protect the electronic component from materials, environmental conditions, and/or manufacturing techniques used to form one or more satellite housings for the electronic component. The satellite housing may be formed, for example, using injection molding techniques. In this case, the protective enclosure protects the electronic component from process stresses that could result in damage caused by the injection molding process. The satellite housing may also be a standard part with an aperture, fitting or interface suitable to receive and retain the electronic assembly. Once the electronic assembly is fitted with the appropriate satellite housing, an electronic package may be formed that is able to withstand harsher environmental conditions that normally would cause damage or malfunctioning of the electronic component. In this manner, the electronic component may provide superior performance and durability throughout the expected life-cycle of the electronic component.

Some embodiments are particularly directed to an enhanced remote sensor unit for a vehicle monitoring system implemented for a motor vehicle. A vehicle monitoring system may comprise any electronic system using one or more remote sensors to collect information about a motor vehicle. Examples of vehicle monitoring systems may include without limitation vehicle safety systems, vehicle performance systems, vehicle control systems, vehicle testing systems, and any other vehicle monitoring systems suitable for use with electronic sensors. The embodiments are not limited in this context.

In one embodiment, for example, a vehicle monitoring system may include a vehicle safety system. Vehicle safety systems may include both active and passive safety devices and systems. Examples of vehicle safety systems may include crash avoidance systems, driver assistance systems, crash detection or crashworthiness systems, and other vehicle safety systems. It may be appreciated that various embodiments for an enhanced remote sensor unit may be used with other vehicle monitoring systems as well. The embodiments are not limited in this context.

The enhanced remote sensor unit provides substantial technical advantages over conventional sensors. For instance, the enhanced remote sensor unit is designed with a compact form factor capable of mounting anywhere throughout a vehicle, particularly in tight areas where there is limited space for a sensor. The enhanced remote sensor unit may also utilize a form factor having standard attachment features and standard interfaces for electrical connection to a vehicle safety system. The standard attachment features allow the enhanced remote sensor unit to be mounted, fastened or attached to a vehicle using standard tools and techniques. The standard interfaces allow the enhanced remote sensor unit to connect to standard industry connectors and wiring harness for a vehicle safety system. The enhanced remote sensor unit is also particularly designed to withstand harsh environmental conditions, including extreme temperatures, mechanical stress, high pressure, residual material stress, chemicals and liquids, corrosion, and other environmental hazards for an electronic device. As a result, the enhanced remote sensor unit may improve affordability, reliability, assembly and performance for electronic sensors and vehicle safety systems.

Figure 1:
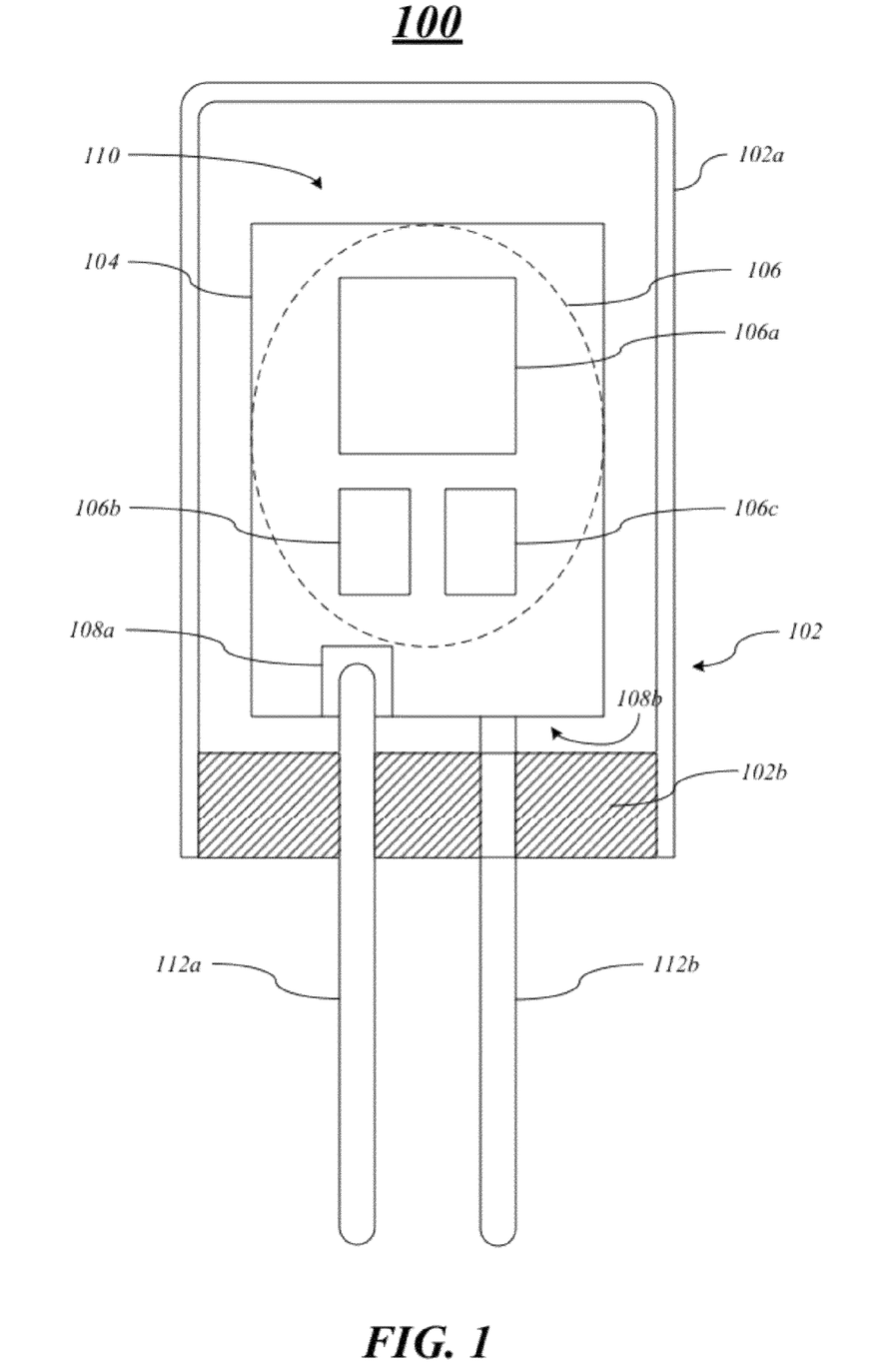
FIG. 1 illustrates a section view of a first electronic assembly.

FIG. 1 illustrates a section view of an electronic assembly 100. As shown, the electronic assembly 100 may comprise an electronic component 110 comprising an electronic sensor 106 arranged to monitor various conditions for a vehicle and output data signals to a vehicle safety system. The electronic assembly 100 may further comprise one or more signal terminals 112a, 112b (up to n signal terminals) coupled to the electronic sensor 106. The electronic assembly 100 may further comprise a protective enclosure 102 arranged to encapsulate the electronic component 110 including the electronic sensor 106 and a portion of the signal terminals 112a, 112b. Although various embodiments may describe the electronic component 110 as including the electronic sensor 106 by way of example and not limitation, it may be appreciated that the electronic component 110 may comprise any electrical or electronic elements suitable for a given device or system. The embodiments are not limited in this context.

The protective enclosure 102 of the electronic assembly 100 is generally arranged to isolate the electronic component 110 from thermal energy, pressure, mechanical stress or other harsh environmental conditions associated with one or more satellite housings. It is also designed to improve robustness for residual material stress, and expand a defined operating environment for the standard satellite housing containing the electronic assembly 100 when fastened to a vehicle. The electronic assembly 100 may be incorporated into various types of satellite housings.

In one embodiment, for example, a first type of satellite housing may be directly formed around the sensory assembly 100 using an injection molding technique. In this case, the protective enclosure 102 protects the electronic component 110 and the electronic sensor 106 from the thermal energy, pressure or residual material stress associated with an injection molding technique used to form the first type of satellite housing. Residual material stress may refer to the initial stress conditions created by various injection molding techniques. Other residual material stress may also occur due to aging and environmental factors. The first type of satellite housing may be discussed in more detail with reference to FIGS. 2, 4.

In another embodiment, for example, a second type of satellite housing may be preformed and specifically modified to receive and retain electronic assembly 100. The electronic assembly 100 may be inserted, mounted, fastened or attached to the second type of satellite housing specifically modified to receive and retain electronic assembly 100. In this case, the protective enclosure 102 protects the electronic component 110 and the electronic sensor 106 from thermal energy, pressure, residual material stress or other harsh environmental conditions associated with the standard satellite housing, inserting the electronic assembly in the second type of satellite housing, or the operating environment for the second type of satellite housing with the electronic assembly 100 when fastened to a particular area of a motor vehicle. The second type of satellite housing may be discussed in more detail with reference to FIG. 4.

The electronic assembly 100 may comprise an electronic component 110. The electronic component 110 may comprise a substrate 104 with the electronic sensor 106 mounted on either side of the substrate 104. The electronic sensor 106 may comprise, or be implemented as, one or more circuit components 106a to 106c. In one embodiment, for example, the electronic sensor 106 may be implemented as a processor 106a, a memory 106b and a transceiver 106c. Other circuit components may include power circuits, filters, capacitors and other circuit elements suitable for implementing the electronic component 110 and/or the electronic sensor 106. The electronic sensor 106 and its constituent parts 106a-106c may be implemented as one or more integrated circuits (ICs) mounted on one or both sides of the substrate 104. It may be appreciated that the electronic sensor 106 may be implemented with any number of circuit components as desired for a given implementation.

The substrate 104 may comprise any known material suitable for receiving an electronic circuit. In one embodiment, for example, the substrate 104 may comprise a printed circuit board (PCB). The PCB may comprise materials such as FR4, Rogers R04003, Kapton, and/or Roger RT/Duroid, for example, and may include one or more conductive traces, via structures, and/or laminates. The PCB also may include a finish such as Gold, Nickel, Tin, or Lead. In various implementations, the PCB may be fabricated using processes such as etching, bonding, drilling, and plating. In some cases, a conductive epoxy may be utilized for various attachments to the substrate 104.

The substrate 104 may comprise a single-sided substrate or a double-sided substrate. The substrate 104 may support single-sided or double-sided population, as well as multi-layer designs (e.g., 2 layer, 4 layer, and so forth). The substrate 104 may include one or more electrical connectors 108 for connection to a corresponding number of signal terminals 112 implemented for the electronic component 110. In one embodiment, for example, the substrate 104 may comprise a double-sided substrate having a first electrical connector 108a disposed on a first side of the substrate 104, and a second electrical connector 108b disposed on a second side of the substrate 104. The first and second electrical connectors 108a, 108b may be connected to one end (or a first portion) of respective first and second signal terminals 112a, 112b. The first and second signal terminals 112a, 112b may be used to convey electrical signals to an external device, such as an electrical interconnect or wiring harness for a vehicle safety system. It may be appreciated that the electronic component 110 can have any number of electrical connectors 108 and signal terminals 112 as desired for a given implementation.

The electronic sensor 106 may be arranged to monitor various conditions for a vehicle and output data signals to a vehicle safety system. Examples for the electronic sensor 106 may comprise without limitation an accelerometer, a decelerometer, an impact (crash) sensor, pressure sensor, a wheel speed sensor, a brake pressure sensor, a seat occupancy sensor, a crush zone sensor, a gyroscope, temperature sensor, and any other electronic sensor capable of providing useful information for a vehicle safety system. An accelerometer monitors and measures the acceleration of a vehicle. A decelerometer monitors and measures the deceleration of a vehicle. An impact sensor monitors and measures impact magnitude at a point of impact of a vehicle. A pressure sensor monitors and measures the pressure on the vehicle at the point of impact relative to the normal pressure on the vehicle. A wheel speed sensor or vehicle speed sensor (VSS) is a type of tachometer used for reading the speed of a vehicle's wheel rotation. Wheel speed sensors are used, for example, in anti-lock braking systems. A brake pressure sensor monitors and measures an amount of brake pressure applied to a brake or braking system. A seat occupancy sensor monitors and measures a weight placed on a seat to determine whether a person is sitting in the seat. A seat occupancy sensor may be used to determine whether to deploy an airbag, activate seatbelt pretensioners and other occupancy restraint systems, and so forth. A crush zone sensor measures the amount a vehicle has been crushed or deformed through contact with other objects during a dynamic crash event. A gyroscope measures the rotation of the vehicle to maintain orientation. In various embodiments, the electronic sensor 106 may be implemented as one or more of the sensors described above, or a combination of any of the sensors described above. Other types of electronic sensors may be implemented for the electronic sensor 106 as well. The embodiments are not limited in this context.

The sensory assembly 100 may further comprise a protective enclosure 102 arranged to encapsulate the electronic component 110 including the electronic sensor 106 and a portion of the signal terminals 112a, 112b. The protective enclosure 102 of the electronic assembly 100 is generally arranged to isolate the electronic component 110 from thermal energy, pressure, residual material stress, mechanical stress or other harsh environmental conditions associated with one or more satellite housings, or an operating environment for the standard satellite housing containing the electronic assembly 100 when fastened to a vehicle. The electronic assembly 100 may be incorporated into various types of satellite housings, such as the first type or second type of satellite housing as previously described. The protective enclosure 102 also provides an additional level of protection beyond that of a given satellite housing used to finally form a remote sensing unit, which lasts throughout a life-cycle for the electronic component 110 and the electronic sensor 106.

The electronic component 110 includes various circuit components and substrates that may degrade when exposed to harsh environmental conditions created when operating a vehicle, such as extreme temperatures, mechanical stress, high pressure, residual material stress, chemicals and liquids, corrosion, and other environmental hazards for an electronic device. As such, the electronic component 110 may be disposed within a satellite housing as some measure of protection against these and other harsh environmental conditions. For example, a first type of satellite housing is formed around the electronic component 110 using some type of injection molding technique. In order to properly protect the electronic component 110, however, a first type of satellite housing typically needs to be made of harder materials capable of withstanding higher temperatures and pressures, such as synthetic polymers. The harder materials are needed, for example, to ensure preservation of signal (transfer function), robust mechanical mounting and application environmental requirements. The higher temperatures and pressures are the process conditions associated with the use of synthetic polymers. Examples of synthetic polymers may include without limitation thermoplastic crystalline polymers such as polybutylene terephthalate (PBT), aromatic polyester polymers such as a liquid crystal polymer (LCP), polyamides such as nylon, and a host of other types of synthetic polymers known to be highly resistant to heat or pressure. Producing a first type of satellite housing with harder materials using injection molding techniques may damage the electronic component 110. For instance, the injection molding techniques expose the electronic component 110 to process temperatures that can affect component performance and/or electrical connections. Further, pressure from injection molding techniques or residual material stress can displace the circuit components 106a to 106c. With the protective enclosure, stress related concerns that affect electrical performance of the electronic component 110 may be reduced.

The protective enclosure 102 may fully encapsulate the electronic component 110 including the electronic sensor 106 and a portion of the signal terminals 112a, 112b. The protective enclosure 102 is specifically designed to provide a defined level of isolation for the electronic component 110 from thermal energy, pressure or residual material stress associated with a particular satellite housing needed for final assembly of a remote sensor unit with the electronic assembly 100. Furthermore, the protective enclosure 102 may provide a rigid body for the electronic assembly 100 for a reliable transfer function as required for some remote sensor unit designs. The protective enclosure 102 also reduces complexity for final assemblies allowing reduced cycle time, labor and cost.

In various embodiments, the protective enclosure 102 may comprise single or multiple portions arranged for assembly into a single hermetically sealed structure. In one embodiment, for example, the protective enclosure 102 may comprise a lid portion 102a and a base portion 102b. The lid portion 102a may house the substrate 104, the electronic sensor 106 and its circuit components 106a-106c, electrical connectors 108, and a portion of the signal terminals 112a, 112b. The base portion 102b may have one or more apertures (e.g., aperture 214 shown in FIG. 2) corresponding to the one or more signal terminals 112a, 112b to receive the signal terminals 112a, 112b. The base portion 102b may have a shape or geometry designed to seamlessly mate with a corresponding shape or geometry formed in the lid portion 102a. During assembly, the lid portion 102a may be placed over the electronic component 110, the base portion 102b may slide over the signal terminals 112a, 112b by inserting the signal terminals 112a, 112b through the corresponding apertures formed in the base portion 102b, and both portions 102a, 102b may be attached to form a single structure. The lid portion 102a and the base portion 102b can be glued, welded, snap-fit, or mechanically fastened, and may use additional sealing technologies such as potting or silicon as an additional sealing layer around an external surface for the protective enclosure 102. In some cases, the portions 102a, 102b may be attached in a manner that provides a hermetically sealed structure.

In various embodiments, the protective enclosure 102 may comprise any material suitable for a given satellite housing or a manufacturing process used to form a satellite housing for the electronic assembly 100. Examples of materials for the protective enclosure 102 may include without limitation a metal, a metallic alloy, a ceramic or a synthetic polymer. The embodiments are not limited in this context.

The protective enclosure 102 may be designed to isolate the electronic component 110 from thermal energy, pressure or residual material stress associated with particular material or a manufacturing process used to form one or more satellite housings. As previously described, the electronic component 110 may be disposed within a first type of satellite housing as some measure of protection against harsh environmental conditions. The first type of satellite housing is typically formed around the electronic component 110 using some type of injection molding technique. In order to properly protect the electronic component 110, however, the first type of satellite housing typically needs to be made of harder materials capable of withstanding higher temperatures and pressures, such as PBT, LCP or Nylon. Producing a first type of satellite housing with these harder materials using injection molding techniques may damage the electronic component 110. For instance, the injection molding techniques expose the electronic component 110 to process temperatures that can affect electrical connections. Further, pressure from injection molding techniques or residual stress can displace the circuit components 106a to 106c.

The protective enclosure 102 may be designed to provide a defined level of thermal isolation for the electronic component 110 from thermal energy associated with an injection molded process used to form one or more satellite housings. Providing a defined level of thermal isolation to protect the electronic component 110 from thermal effects of an injection molding process would allow the electronic assembly 100 to be directly placed in the injection process without risk of compromising the device performance characteristics and/or the electrical connections. This provision allows for the reduction of downstream assembly processes which supports manufacturing efficiencies. For example, if a standard soldered PCB would be placed in an injection molding process, the associated process temperature would reflow the joint resulting in disconnection of the components and malfunction of the device Typical temperature ranges for various molding materials may include without limitation Nylon 6/12 at 265° C., PBT at 225° C., and LCP at 335° C., among others.

The protective enclosure 102 may be designed to provide a defined level of pressure isolation for the electronic component 110 from pressure associated with an injection molded process used to form one or more satellite housings. Providing a defined level of pressure isolation to protect the electronic component 110 from pressure effects of an injection molding process would allow the electronic assembly 100 to be directly placed in the injection process without risk of compromising the electrical connections. This provision allows for the reduction of downstream assembly processes which supports manufacturing efficiencies. For example, if a standard soldered PCB would be placed in an injection molding process, the associated process temperature would reflow the joint and the pressure would displace the components resulting in disconnection of the components and malfunction of the device. Injection molding pressures will vary greatly based on the part & mold design. For example, process pressures may range anywhere from 1500 to 2500 PSI. In some cases, process pressures may be even greater depending on design complexity. For example, the pressure range may be 5000 PSI or greater. Pressure associated with a given process will also depend on a selected material and cavitation of the molds.

The protective enclosure 102 may be designed to provide a defined level of residual material stress isolation for the electronic component 110 from residual material stress associated with an injection molded process used to form one or more satellite housings. Providing a defined level of residual material isolation protects the electronic component 110 from residual material stresses associated with standard materials such as PBT, LCP, or Nylon, and allows for the use of standard electrical components (e.g., electronic component 110, sensor 106 and circuit components 106a-106c, and associated circuitry) in an injection molding process. Current injection methods and materials can result in a high internal residual stress which can damage electrical components. This can be the residual stress associated with material setup, and or thermal expansion mismatches between the electrical assembly and encapsulation material. The residual stress can also have an impact on the performance of active devices. Providing isolation from the residual stresses can improve reliable performance of the full assembly.

It is worthy to note that although some embodiments include one or more signal terminals 112 partially encapsulated by the protective enclosure 102, it may be appreciated that other embodiments may fully encapsulate one or more signal terminals 112, and have electrical contacts, pads, pins, bumps or other signal interconnects formed on the protective enclosure 102 to form an electrical connection between the signal terminals 112 and an external system. In this case, the one or more signal terminals 112 are positioned to make contact with the signal interconnects on an internal surface of the protective enclosure 102, and an external system may have corresponding signal terminals designed to make contact with the signal interconnects on an external surface of the protective enclosure 102. The embodiments are not limited in this context.

It is also worthy to note that some embodiments may reduce or eliminate the use of the signal terminals 102 completely. For example, the electronic component 110 may have one or more wireless transceivers or radios to communicate the sensor information between the electronic component 110 and an external system. In this case, the protective enclosure 102 may fully encapsulate the electronic component 110 to provide an increase level of protection and isolation. The embodiments are not limited in this context.

Figure 2:
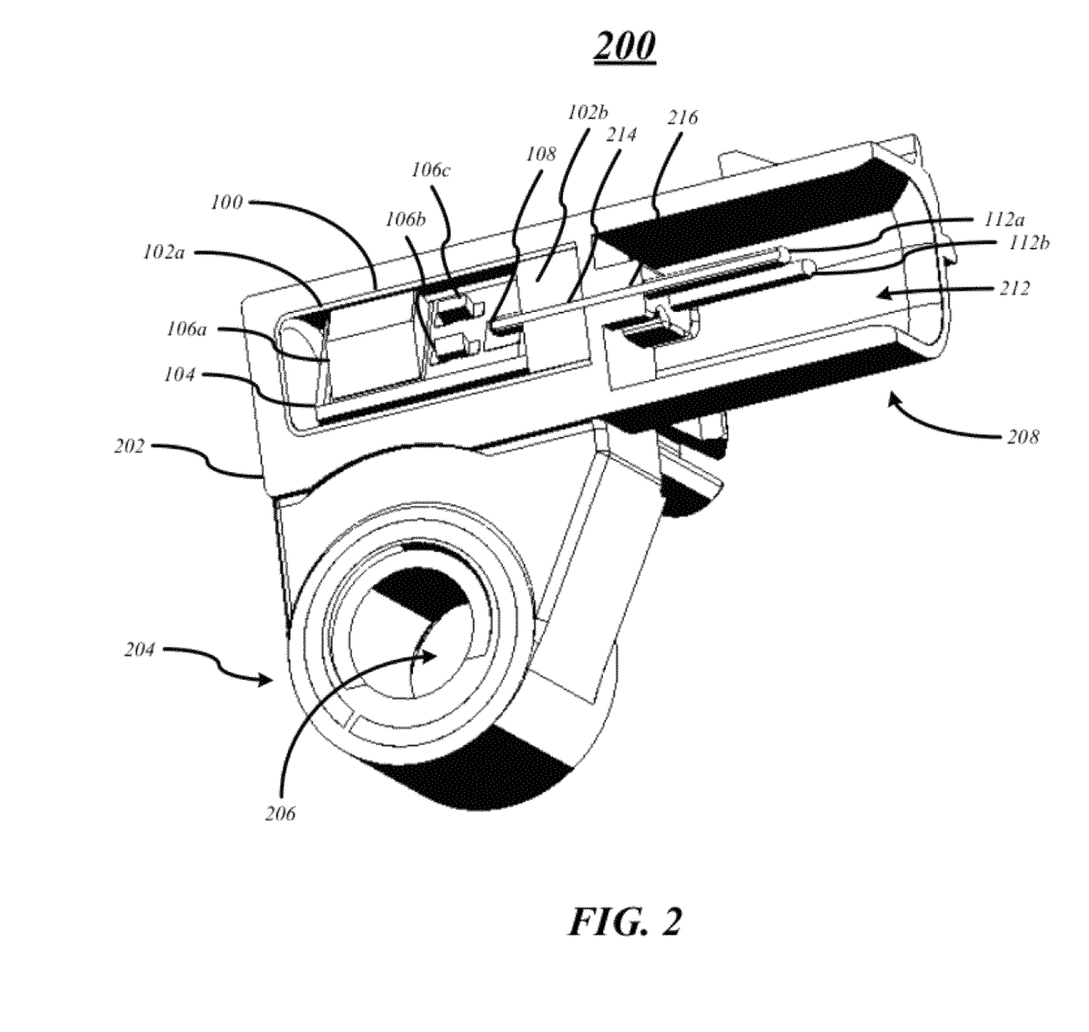
FIG. 2 illustrates a section perspective view of a first remote sensor unit.

FIG. 2 illustrates a side perspective view of a remote sensor unit 200. The remote sensor unit 200 may comprise, for example, the electronic assembly 100 encased in a satellite housing 202. The satellite housing 202 may represent an example for a first type of satellite housing. The satellite housing 202 may be arranged to encapsulate the protective enclosure 102 of the electronic assembly while exposing one end (or a second portion) of the signal terminals 112a, 112b for interconnection to a wiring harness for a vehicle safety system.

In various embodiments, the satellite housing 202 may be an overmold formed around the electronic assembly 100 using an overmold material. An overmold material may generally comprise any thermoplastic or thermosetting plastic materials suitable for an injection molding manufacturing process to create an overmold around the electronic assembly 100. In some embodiments, the overmold material may be selected from a class of harder materials capable of withstanding higher temperatures and pressures typically found in an operating environment for a motor vehicle. Examples of overmold materials may include without limitation various synthetic polymers such as PBT, LCP or Nylon. Other overmold materials may comprise a metal or metallic alloy. A particular overmold material for a given implementation may be selected based on a particular operating environment, and should have structural properties to ensure adequate protection for the electronic assembly 100 and sufficient to maintain a fastening load over a life-cycle for the remote sensing unit 200. Further, the selected overmold material should be sufficiently strong to prevent deformation during a dynamic crash event. The embodiments are not limited in this context.

In one embodiment, for example, the satellite housing 202 may comprise a one-piece polymer molded overmold. The one-piece polymer molded overmold may be formed using any known injection molded technique. For example, the electronic assembly 100 may be directly inserted into a mold cavity used in an injection molding process, and the overmold material may be heated into liquid form and forced into the mold cavity where it cools and hardens to the configuration of the mold cavity.

In one embodiment, for example, the satellite housing 202 may comprise a two-piece polymer molded overmold. As with the protective enclosure 102, a first polymer overmold piece may be designed to seamlessly mate with a second polymer overmold piece to form a hermetically sealed structure. The first and second polymer overmold pieces may be positioned around the electronic assembly 100. The first and second polymer overmold pieces can then be glued, welded, snap-fit, or mechanically fastened, and may use additional sealing technologies such as potting or silicon as an additional sealing layer around an external surface for the satellite housing 202.

The satellite housing 202 may be formed in different sizes, shapes, geometries or form factors suitable for mounting the remote sensor unit 200 on a vehicle, and also for interconnecting to a vehicle safety system. In the illustrated embodiment shown in FIG. 2, the remote sensor unit 200 may include a fastener portion 204 and an interface portion 208. The fastener portion 204 may be formed in a shape to fasten to a vehicle, and may be insert molded at the same time as overmold of the satellite housing 202. The fastener portion 204 may have an aperture 206 for receiving a post, bolt or other fastener suitable for mounting the remote sensor unit 200 to a vehicle. The interface portion 208 may be formed to interconnect to a vehicle safety system. For example, the interface portion 208 may have an aperture 212 with one end of the signal terminals 112a, 112b exposed for electrical connection to a communication media for a vehicle safety system. The aperture 212 protects the signal terminals 112a, 112b, while providing a fitting for a mating connector used by a given vehicle safety system. It may be appreciated that the satellite housing 202 in general may have any number of interfaces specifically designed for vehicle applications, and that the fastener portion 204 and the interface portion 208 may have any size, shape or geometry suitable for corresponding mating connectors. The embodiments are not limited in this context.

Although various embodiments illustrate the electronic assembly 100 inserted into various types of satellite housings 202, it may be appreciated that other embodiments may directly embed the electronic assembly 100 into various parts of a vehicle without using a satellite housing 202. In this case, the protective enclosure 102 may be designed to provide sufficient protection to allow the electronic assembly 100 to be directly inserted into a vehicle part before or after the vehicle part has been manufactured. For instance, various portions of a vehicle body may have one or more sensor assemblies 100 placed into the body portions while the body portions are being manufactured. By way of example, the electronic assembly 100 may be designed to be crash detection sensors that are directly embedded within front and rear bumpers for a vehicle with appropriate wired or wireless connections for an external system. In a sense, the vehicle part itself would operate as essentially the satellite housing 202. This would save time, expense and space associated with equipping various vehicle parts with electronic sensors further down in the manufacturing process. In other embodiments, the satellite housing 202 may be manufactured or formed as part of the vehicle part, and the electronic assembly 100 may be inserted into the satellite housing 202 formed in a given vehicle part or component. Suitable vehicle parts may include without limitation vehicle frames, supports, brackets, assemblies or other appropriate structures or components for a vehicle. The embodiments are not limited in this context.

The use of the satellite housing 202 combined with the electronic assembly 100 to form the remote sensor unit 200 provides several unique advantages over conventional remote sensor units. For example, the satellite housing 202 for the remote sensor unit 200 may be formed from harder materials using injection molded techniques. The harder materials may provide superior protection to the electronic assembly 100 from harsh environmental conditions, including extreme temperatures, mechanical stress, high pressure, residual material stress, chemicals and liquids, corrosion, and other environmental hazards for the electronics in the electronic assembly 100. In another example, the satellite housing 202 may be custom formed with any number of fastener and interface features simply by changing a configuration for a mold cavity. This allows the remote sensing unit 200 to be attached anywhere on a vehicle and interoperate with any vehicle safety system. In still another example, the remote sensor unit 200 can utilize the satellite housing 202 formed to house the electronic assembly 100 in a manner that properly orients the electronic assembly 100 (e.g., z-axis sensing). In still another example, the remote sensor unit 200 reduces in-vehicle packaging allocation space due to the flexibility in designing the satellite housing 202 (e.g., as a custom or standard industry fastener). In yet another example, the remote sensor unit 200 reduces or eliminates any possible cantilever housing oscillations (e.g., resonance). In yet another example, the satellite housing 202 may be formed into standard industry fasteners with their concomitant advantages as described in detail with reference to FIGS. 4A-4D. Other advantages exist as well.

Figure 3A:
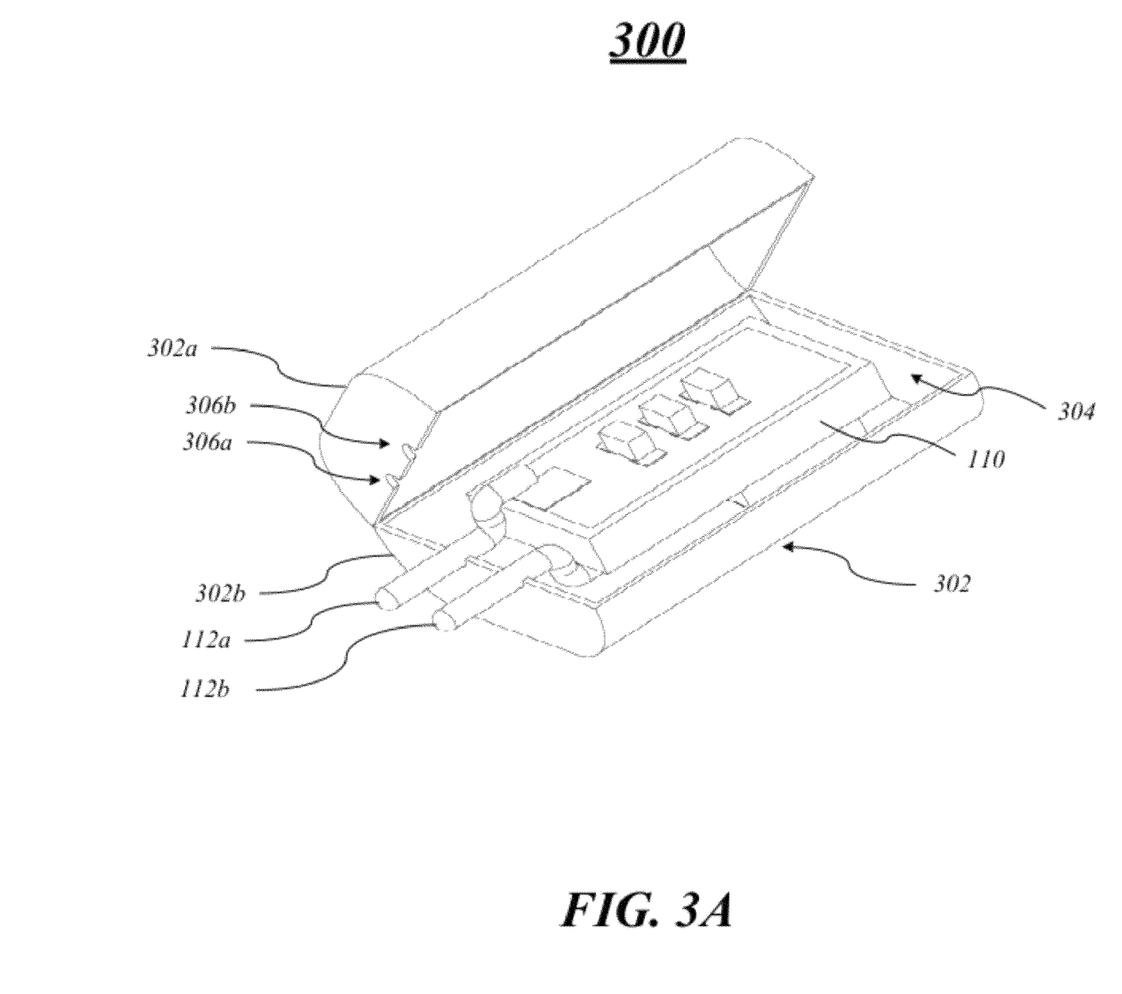
FIG. 3A illustrates a first perspective view of a protective enclosure.
Figure 3B:
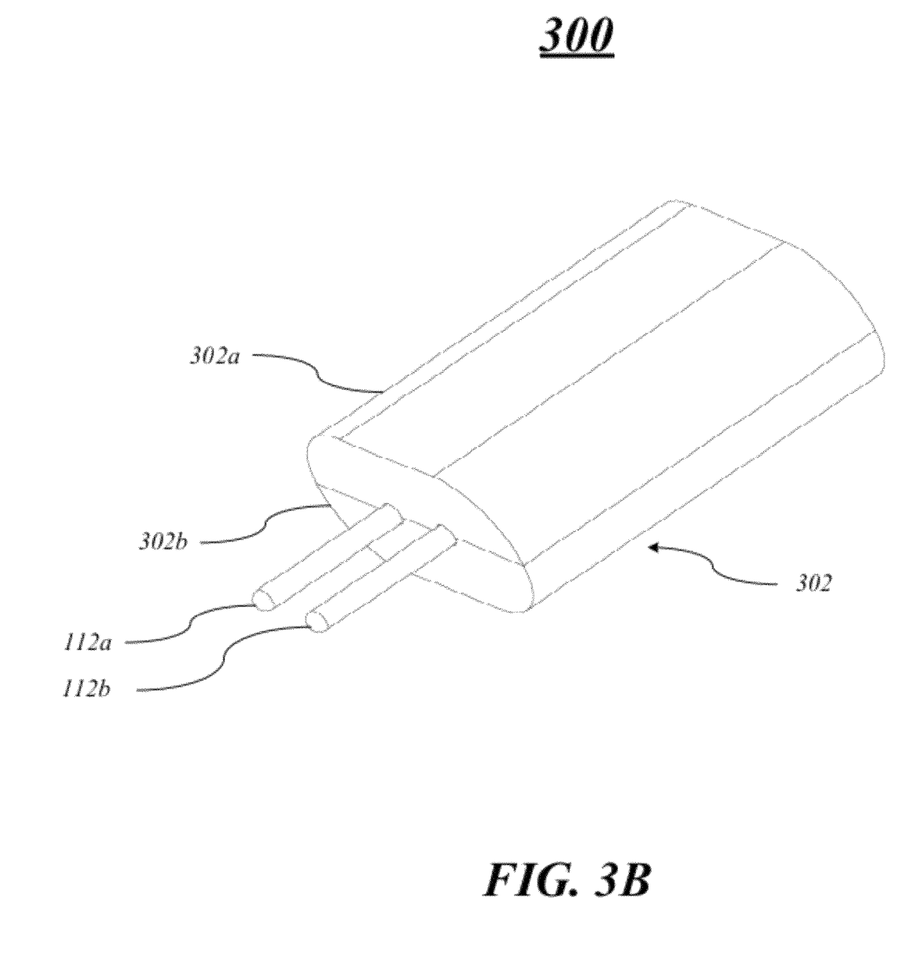
FIG. 3B illustrates a second perspective view of a protective enclosure.

FIGS. 3A, 3B illustrate different perspective views of an electronic assembly 300. The electronic assembly 300 may be similar to the electronic assembly 100 with a different protective enclosure 302. In one embodiment, for example, the protective enclosure 302 may comprise a snap-fit protective enclosure. The embodiments, however, are not limited to this example.

FIG. 3A illustrates the electronic assembly 300 with a protective enclosure 302 in an open position. The electronic assembly 300 may comprise the protective enclosure 302 formed to encapsulate the electronic component 110 and a portion of the signal terminals 112a, 112b. The protective enclosure 302 may comprise a snap fit housing comprising a top portion 302a and a bottom portion 302b. The electronic component 110 may be inserted into an internal cavity 304 formed to securely receive the electronic component 110. Once inserted, the portions 302a, 302b can be glued, welded, snap-fit, or mechanically fastened, and additional sealing technologies such as potting or silicon may be used to form an additional sealing layer around an external surface for the protective enclosure 302. In some cases, but not in all cases, the portions 302a, 302b may be attached in a manner that provides a hermetically sealed structure. When fastened, the protective enclosure 302 may form apertures 306a, 306b fitted to receive the signal terminals 112a, 112b, thereby exposing a portion of the signal terminals 112a, 112b to a vehicle monitoring system.

FIG. 3B illustrates the electronic assembly 300 with the protective enclosure 302 in a closed position. When in the closed position, the protective enclosure 302 completely encapsulates the electronic component 110 and one end (or a first portion) of the signal terminals 112a, 112b (attached to the electronic component 110). Another end (or a second portion) of the signal terminals 112a, 112b may remain exposed for interconnection to a wiring harness for a vehicle safety system.

FIGS. 4A-4E illustrate different views of a remote sensor unit 400. As with the remote sensor unit 200, the remote sensor unit 400 may comprise a satellite housing 402 capable of receiving and holding the electronic assembly 100. The satellite housing 402, however, is not formed using an injection molded technique where the electronic assembly 100 is directly placed in the injection process. Rather, the satellite housing 402 is an example of a second type of satellite housing preformed and specifically modified to receive and retain electronic assembly 100. The electronic assembly 100 may be inserted, mounted, fastened or attached to the satellite housing 402 specifically modified to receive and retain electronic assembly 100. For example, the sensory assembly 100 is fitted within the satellite housing 402 in a downstream assembly process in order to finally assemble the remote sensor unit 400. In this manner, the satellite housing 402 may be manufactured using any processes and materials suitable for the operational aspects of the satellite housing 402 without potentially causing damage to the electronic assembly 100.

The satellite housing 402 may have any size, shape, geometry or form factor used by a standard industry fastener. In the illustrated embodiments shown in FIGS. 4A-4C, for example, the satellite housing 402 may be formed in the shape of a standard industry bolt for a vehicle, the bolt having a common square or hexagonal fastener head and a threaded body. Other standard industry fasteners may be used as well for the satellite housing 402. In this manner, the remote sensing unit 400 may be installed onto a motor vehicle with standard tools and processes, and avoids the need for custom designed housings and their corresponding custom designed tools and processes.

Figures 4A, 4B:
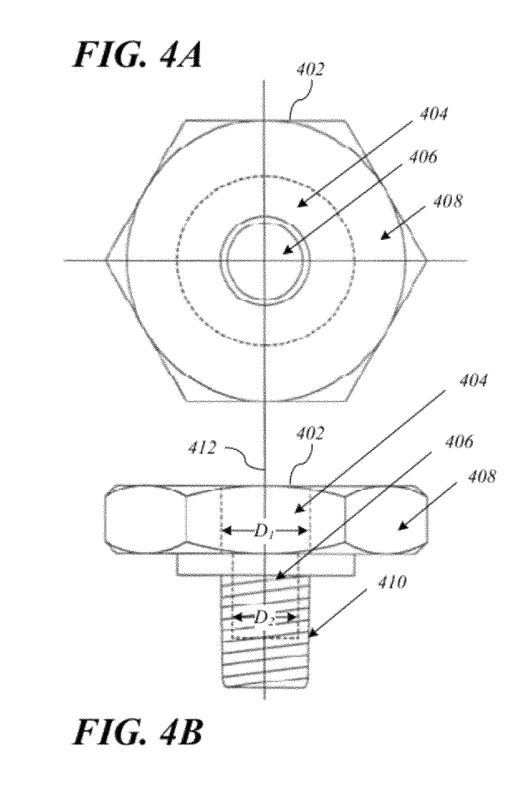
FIG. 4A illustrates a first top view of a third remote sensor unit.
FIG. 4B illustrates a first section view of a third remote sensor unit.

FIG. 4A illustrates a first top view of the remote sensor unit 400 without the electronic assembly 100 inserted into the satellite housing 402. As shown in FIG. 4A, the satellite housing 402 may comprise a fastener head 408 formed in a hexagonal shape. The fastener head 408 may have one or more apertures formed to receive the electronic assembly 110. For instance, the fastener head 408 illustrates openings for a first aperture 404 and a second aperture 406 formed to receive the electronic assembly 110.

FIG. 4B illustrates a first side view of the remote sensor unit 400 without the electronic assembly 100 inserted into the satellite housing 402. As shown in FIG. 4B, the satellite housing 402 may comprise the fastener head 408 formed in a hexagonal shape and a fastener body 410 formed as a threaded body. The fastener head 408 may have the aperture 404, and the fastener body 410 may have aperture 406. The first and second apertures 404, 406 are contiguous along axis 412 and may both be accessed via the fastener head 408.

The first and second apertures 404, 406 may have different dimensions to accommodate different portions of the electronic assembly 100. For instance, the first and second apertures 404, 406 may have respective first and second diameters $D_1$, $D_2$. In one embodiment, for example, the first diameter $D_1$ for the first aperture 404 is larger than the second diameter $D_2$ for the second aperture 406. This is because the second aperture 406 is designed to receive the electronic assembly 100 as defined by the protective enclosure 102, while the first aperture 404 is designed to house exposed portions of the signal terminals 112a, 112b of the electronic assembly 110. The smaller diameter for the second diameter $D_2$ for the second aperture 406 ensures a tight fit for the protective enclosure 102 of the electronic assembly 100. The larger diameter for the first diameter $D_1$ for the first aperture 404 allows room for a connector used by a vehicle safety system to enter the first aperture 404 to establish an electrical connection with the exposed ends of the signal terminals 112a, 112b.

Figure 4C:
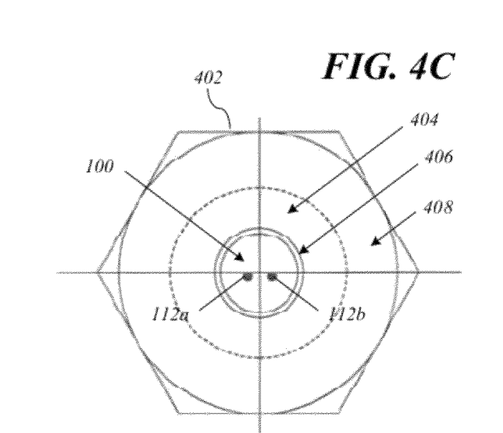
FIG. 4C illustrates a second top view of a third remote sensor unit.

FIG. 4C illustrates a second top view of the remote sensor unit 400 with the electronic assembly 100 inserted into the satellite housing 402. As shown in FIG. 4C, the protective enclosure 102 of the electronic assembly 100 is inserted into the satellite housing 402 in a manner that exposes one end of the signal terminals 112a, 112b within the aperture 404 thereby making them accessible for electrical interconnection to a vehicle safety system through the fastener head 408.

Figure 4D:
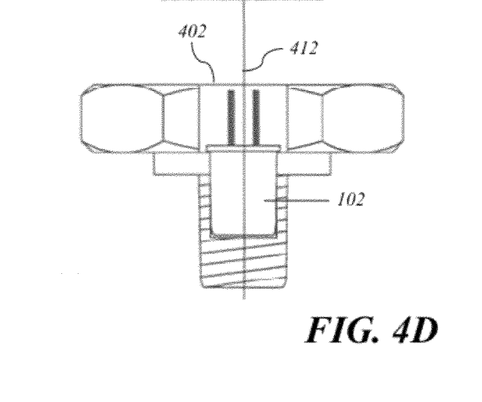
FIG. 4D illustrates a second section view of a third remote sensor unit.

FIG. 4D illustrates a second side view of the remote sensor unit 400 with the electronic assembly 100 inserted into the satellite housing 402. As shown in FIG. 4D, the protective enclosure 102 of the electronic assembly 100 is inserted into the satellite housing 402 until the electronic assembly 100 is fully seated in the aperture 406. The second aperture 406 is arranged to receive the protective enclosure 102 of the electronic assembly 100 and the first aperture 404 is arranged to expose the second portion of the signal terminals 112a, 112b for electrical interconnection to the vehicle safety system. The protective enclosure 102 may have a diameter $D_3$ which is slightly smaller than the diameter $D_2$ for the second aperture 406 to allow the second aperture 406 to receive and retain the protective enclosure 102. In some cases, an adhesive, glue, insulating potting or other bonding agent may be used to retain the electronic assembly 100 in the second aperture 406. Examples of adhesives may comprise synthetic polymer glues such as an epoxy resin, RTV and other appropriate adhesives.

The apertures 404, 406 for the remote sensor unit 400 may be formed such that an axis 412 for the apertures 404, 406 is aligned with an axis 422 for the signal terminals 112a, 112b when the electronic assembly 100 is properly seated in the apertures 404, 406. In this manner, the signal terminals 112a, 112b are automatically oriented for proper electrical interconnection with a communications medium for a vehicle safety system.

The use of the satellite housing 402 combined with the electronic assembly 100 to form the remote sensor unit 400 provides several unique advantages over conventional remote sensor units. For example, a standard industry fastener can be modified to become the remote sensor unit 400 so that it can sense physical conditions for a vehicle. In another example, the remote sensor unit 400 can be formed using "off-the-shelf" fasteners modified to receive and retain the electronic assembly 100. In yet another example, the remote sensor unit 400 can utilize a standard industry fastener modified to receive and retain the electronic assembly 100 in a manner that properly orients the electronic assembly 100 (e.g., z-axis sensing). In still another example, the remote sensor unit 400 reduces in-vehicle packaging allocation space due to the use of a standard industry fastener. In yet another example, the remote sensor unit 400 reduces or eliminates any possible cantilever housing oscillations (e.g., resonance). Other advantages exist as well.

Figure 4E:
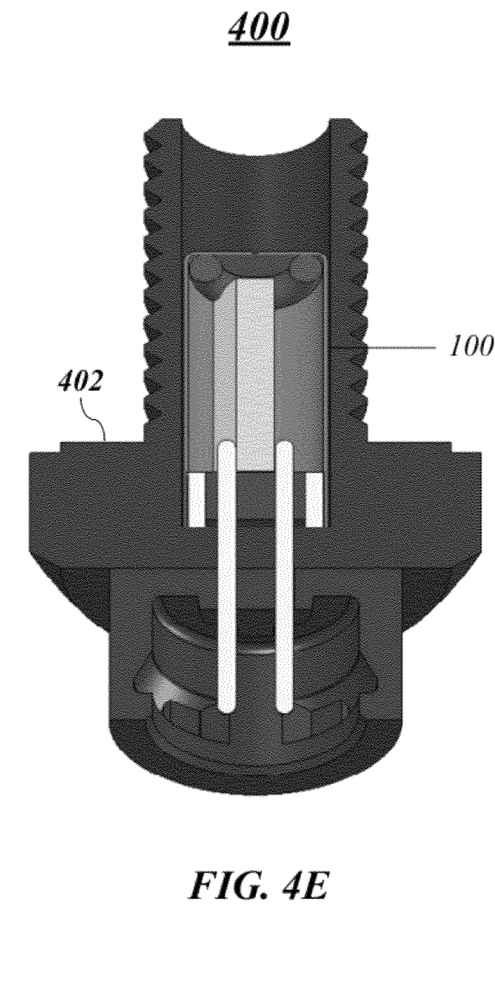
FIG. 4E illustrates a section perspective view of a third remote sensor unit.

FIG. 4E illustrates a section perspective view of the remote sensor unit 400. More particularly, the illustrated embodiment shown in FIG. 4E shows a section perspective view of the electronic assembly 100 and the satellite housing 402.

Figure 5:
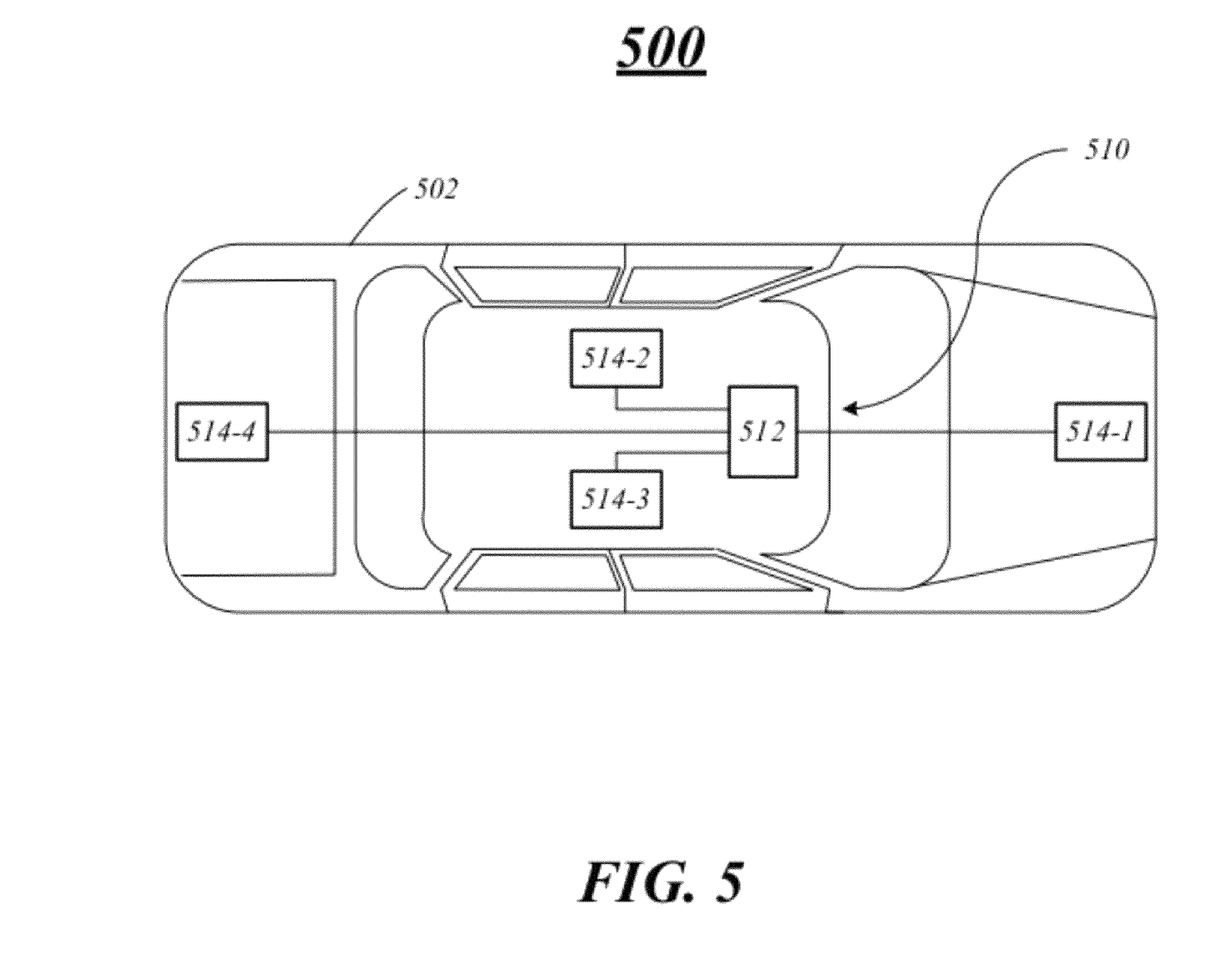
FIG. 5 illustrates an embodiment of an operating environment.

FIG. 5 illustrates an embodiment of an operating environment 100. The operating environment 100 may comprise a motor vehicle 502 having a vehicle monitoring system 510 for the motor vehicle 502. In one embodiment, for example, the vehicle monitoring system 510 may be implemented as a vehicle safety system. Although some embodiments are described with reference to a vehicle safety system, such as the vehicle monitoring system 510, it may be appreciated that other embodiments may be used with any type of monitoring system useful for the motor vehicle 502. Examples of monitoring systems may include without limitation vehicle safety systems, vehicle performance systems, vehicle control systems, vehicle testing systems, and any other monitoring systems suitable for use with electronic sensors. The embodiments are not limited in this context.

The vehicle monitoring system 510 may comprise, or be implemented as, any safety system utilizing remote sensor units and suitable for the motor vehicle 502. Vehicle monitoring system 510 may comprise both active and passive safety devices and systems. Examples of vehicle safety systems 510 may include without limitation crash avoidance systems, driver assistance systems, crash detection systems (or crashworthiness systems), and other vehicle safety systems. Further examples of vehicle safety systems 510 may comprise without limitation seatbelt pretensioner systems, airbag systems, occupant restraint system, infrared night vision systems to increase seeing distance beyond headlamp range, tire pressure monitoring systems or deflation detection systems, reverse backup sensors which alert drivers to difficult-to-see objects in their path when reversing, backup cameras, lane departure warning systems to alert the driver of an unintended departure from the intended lane of travel, traction control systems which restore traction if driven wheels begin to spin, electronic stability control which intervenes to avert an impending loss of control, anti-lock braking systems, electronic brakeforce distribution systems, emergency brake assist systems, cornering brake control systems, adaptive headlamps swivels headlamps around corners, automatic high beams which automatically adapts the headlamp range to the distance of vehicles ahead or which are oncoming, adaptive cruise control which maintains a safe distance from the vehicle in front, precrash systems, automated parking systems, among others. The embodiments are not limited in this context.

In the illustrated embodiment shown in FIG. 5, the vehicle monitoring system 510 may comprise one or more remote sensor units 514-1-$m$. The remote sensor units 514-1-$m$ may be implemented as one or both of the remote sensor units 200, 400 having the electronic assembly 100. The remote sensor units 514-1-$m$ may be located throughout the motor vehicle 502. For example, possible front locations for the remote sensor units 514-1-$m$ may include a radiator support or front bumper, possible side locations for the remote sensor units 514-1-$m$ may include door pillars between the doors, and possible rear locations for the remote sensor units 514-1-$m$ may include a rear bumper. Other locations are possible. The remote sensor units 514-1-$m$ may be bolted to the motor vehicle 502 (e.g., the vehicle frame) via the fastening portions of the satellite housings 202, 402, or directly molded into vehicle parts or components The vehicle monitoring system 510 may also have a controller 512 connected to the signal terminals 112$a$, 112$b$ of the respective sensor assemblies 100. The controller 512 may be operative to receive data from the electronic sensor 106 and use the data to determine whether to activate a safety system for the motor vehicle 502. The controller 512 may comprise, or be implemented as, a part of an electronic control unit (ECU) or airbag control unit (airbag control unit) for the vehicle monitoring system 510. The controller 512 and/or the ECU and/or the airbag control unit may be enclosed in a metal housing for protection, and bolted somewhere to the motor vehicle 502 (e.g., the vehicle frame). In some instances, the controller 512 may be implemented as part of a remote sensor unit 514-1-$m$, or may itself be a remote sensor unit 514-1-$m$.

In one embodiment, for example, the vehicle monitoring system 510 may comprise multiple remote sensor units 514-1-$m$ each with signal terminals 112$a$, 112$b$ connected to the controller 512. The controller 512 may be operative to receive multiple sets of data from the electronic sensors 106 and use the multiple sets of data to determine whether to deploy a safety system for a vehicle. For instance, the vehicle monitoring system 510 may be implemented as a crash detection system and the remote sensor units 514-1-$m$ may be impact or crash detection sensors. The vehicle monitoring system 510 may monitor and collect data from the remote sensor units 514-1-$m$ by the controller 112 which is implemented as part of an airbag control unit. The airbag control unit may calculate an angle of impact, severity and force of an impact to determine whether to deploy one or more airbag stages. It may be appreciated that this is merely one example for the vehicle monitoring system 510 and the remote sensor units 514-1-$m$, and other implementations are possible as well. The embodiments are not limited in this context.

Various embodiments, such as the electronic component 110 and electronic sensor 106 of the electronic assembly 100, may be implemented using hardware elements, software elements, or a combination of both. Examples of hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. For instance, the electronic component 110 may include various processors and communications interfaces, including wired or wireless communications interfaces. Examples of wireless communications interfaces may include wireless transceivers or radios and supporting architecture (e.g., filters, baseband processors, antennas, and so forth). Examples of software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An electronic assembly, comprising:
   an electronic component comprising an electronic sensor arranged to monitor conditions for a vehicle;
   one or more signal terminals coupled to the electronic sensor;
   a protective enclosure arranged to encapsulate at least the electronic component to isolate the electronic component from thermal energy, pressure or residual material stress; and
   a satellite housing arranged to encapsulate the protective enclosure, the satellite housing adapted to mount to the vehicle.

2. The electronic assembly of claim 1, the electronic component comprising a substrate having the electronic sensor mounted on one or both sides of the substrate.

3. The electronic assembly of claim 1, the electronic component comprising a double-sided substrate having a first electrical connector disposed on a first side of the substrate and a second electrical connector disposed on a second side of the substrate, the first and second electrical connectors connected to respective first and second signal terminals.

4. The electronic assembly of claim 1, the electronic sensor comprising an integrated circuit, and the electronic component comprising a printed circuit board having the integrated circuit mounted on one side of the printed circuit board.

5. The electronic assembly of claim 1, the electronic sensor comprising an accelerometer, a decelerometer, an impact sensor, pressure sensor, a wheel speed sensor, a brake pressure sensor, a seat occupancy sensor, a crush zone sensor, a temperature sensor or a gyroscope.

6. The electronic assembly of claim 1, the protective enclosure comprising a single portion formed into a single hermetically sealed structure.

7. The electronic assembly of claim 1, the protective enclosure comprising multiple portions arranged for assembly into a single hermetically sealed structure.

8. The electronic assembly of claim 1, the protective enclosure comprising a lid portion and a base portion, the lid portion to house the electronic sensor and a portion of the signal terminals, the base portion having one or more apertures corresponding to the one or more signal terminals to receive the signal terminals and mate with the lid portion to form a hermetically sealed structure.

9. The electronic assembly of claim 1, the protective enclosure comprising a metal, a metallic alloy, a ceramic or a synthetic polymer.

10. The electronic assembly of claim 1, the protective enclosure arranged to isolate the electronic component from thermal energy, pressure or residual material stress associated with a material or manufacturing technique used to form one or more satellite housings.

11. The electronic assembly of claim 1, the protective enclosure arranged to encapsulate the electronic component including the electronic sensor and a portion of the signal terminals.

12. The electronic assembly of claim 1, the protective enclosure arranged to encapsulate the electronic component including the electronic sensor and the signal terminals.

13. The electronic assembly of claim 1, the electronic sensor arranged to monitor conditions for a vehicle and output data signals to a vehicle monitoring system.

14. The electronic assembly of claim 1, the satellite housing comprising a single portion formed into a single hermetically sealed structure.

15. The electronic assembly of claim 1, the satellite housing comprising multiple portions arranged for assembly into a single hermetically sealed structure.

16. The electronic assembly of claim 1, the satellite housing comprising an overmold created using an overmold material comprising a thermoplastic or thermosetting plastic.

17. The electronic assembly of claim 1, the satellite housing formed as a vehicle part.

18. The electronic assembly of claim 1, the satellite housing formed in a shape of a standard fastener.

19. The electronic assembly of claim 1, the satellite housing comprising a standard fastener having an aperture aligned with an axis for the signal terminals for automatically orienting the signal terminals for electrical interconnection with a communications medium.

* * * * *